(12) United States Patent
Gui et al.

(10) Patent No.: US 11,094,799 B2
(45) Date of Patent: Aug. 17, 2021

(54) THIN FILM TRANSISTOR AND MANUFACTURING METHOD THEREOF, ARRAY SUBSTRATE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Bingqiang Gui, Beijing (CN); Lianjie Qu, Beijing (CN); Yonglian Qi, Beijing (CN); Hebin Zhao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 625 days.

(21) Appl. No.: 15/780,166

(22) PCT Filed: Sep. 30, 2017

(86) PCT No.: PCT/CN2017/104881
§ 371 (c)(1),
(2) Date: May 30, 2018

(87) PCT Pub. No.: WO2018/176784
PCT Pub. Date: Oct. 4, 2018

(65) Prior Publication Data
US 2021/0083071 A1    Mar. 18, 2021

(30) Foreign Application Priority Data

Mar. 29, 2017 (CN) .......................... 201710204453.X (51) Int. Cl.
*H01L 21/44* (2006.01)
*H01L 29/40* (2006.01)
(Continued)

(52) U.S. Cl.
CPC ........ *H01L 29/6675* (2013.01); *H01L 29/401* (2013.01); *H01L 29/41733* (2013.01);
(Continued)

(58) Field of Classification Search
CPC .................... H01L 29/66765; H01L 29/66924
(Continued)

(56) References Cited

U.S. PATENT DOCUMENTS 8,851,951 B2 * 10/2014 Park .................... H01L 51/5221
445/24
10,373,985 B2 * 8/2019 Kim ...................... H01L 25/167
(Continued)

FOREIGN PATENT DOCUMENTS

CN    1786801 A    6/2006
CN    102956649 A    3/2013
(Continued)

OTHER PUBLICATIONS

First Office Action issued in related Chinese Patent Application No. 201710204453.X, dated Aug. 5, 2019, with English translation.
(Continued)

*Primary Examiner* — Calvin Lee
(74) *Attorney, Agent, or Firm* — McDermott Will and Emery LLP (57) ABSTRACT

A thin film transistor includes: a bottom gate electrode; a bottom gate electrode insulating layer, a semiconducting active layer and a first insulating layer which are disposed on the bottom gate electrode in sequence; a source electrode and a drain electrode which are disposed at a side of the first insulating layer away from the bottom gate electrode; vias disposed in the first insulating layer at positions which correspond to the source electrode and the drain electrode respectively; and ohmic contact layers disposed on and covering the semiconducting active layer at positions cor-
(Continued)

responding to the vias respectively. Each of the source electrode and the drain electrode is in contact with a corresponding one of the ohmic contact layers through a corresponding one of the vias.

9 Claims, 6 Drawing Sheets

(51) Int. Cl.
*H01L 29/66* (2006.01)
*H01L 29/417* (2006.01)
*H01L 29/786* (2006.01)
*H01L 29/16* (2006.01)
*H01L 29/45* (2006.01)

(52) U.S. Cl.
CPC .. *H01L 29/66765* (2013.01); *H01L 29/78636* (2013.01); *H01L 29/78648* (2013.01); *H01L 29/1604* (2013.01); *H01L 29/458* (2013.01)

(58) Field of Classification Search
USPC ........................... 438/666–675; 257/773–775
See application file for complete search history.

(56) References Cited

U.S. PATENT DOCUMENTS

| | | | |
|---|---|---|---|
| 10,403,651 B2* | 9/2019 | Kim | .................. H01L 29/41733 |
| 2008/0061446 A1 | 3/2008 | You | |
| 2009/0098673 A1 | 4/2009 | Yang et al. | |
| 2011/0278565 A1* | 11/2011 | Yim | .................... H01L 29/7869 |
| | | | 257/43 |
| 2013/0299837 A1 | 11/2013 | Hayashi et al. | |
| 2014/0145199 A1 | 5/2014 | Shi | |

FOREIGN PATENT DOCUMENTS

| | | |
|---|---|---|
| CN | 103329275 A | 9/2013 |
| CN | 104465788 A | 3/2015 |
| CN | 106384748 A | 2/2017 |
| CN | 106920836 A | 7/2017 |
| JP | H7-263704 A | 10/1995 |

OTHER PUBLICATIONS

International Search Report and Written Opinion issued in International Patent Application No. PCT/CN2017/104881, dated Jan. 5, 2018; with English translation.

* cited by examiner

THIN FILM TRANSISTOR AND MANUFACTURING METHOD THEREOF, ARRAY SUBSTRATE AND DISPLAY DEVICE

CROSS-REFERENCE TO RELATED APPLICATION

This application is a national phase entry under 35 USC 371 of International Patent Application No. PCT/CN2017/104881 filed on 30 Sep. 2017, which claims priority to Chinese Patent Application No. 201710204453.X filed on Mar. 29, 2017 and titled "THIN FILM TRANSISTOR AND MANUFACTURING METHOD THEREOF, ARRAY SUBSTRATE AND DISPLAY DEVICE", which are incorporated herein by reference in their entirety.

TECHNICAL FIELD

The present disclosure relates to the field of semiconductor technology, and more particularly, to a thin film transistor and a manufacturing method thereof, an array substrate and a display device.

BACKGROUND

In a liquid crystal display (LCD) device or an organic light emitting diode (OLED) display device, a plurality of thin film transistors (TFT) are disposed on an array substrate, and configured to drive sub-pixels of the above display device. In a manufacturing process of the TFT in the prior art, under influence from the manufacturing process, many defects are generated in a semiconducting active layer of the TFT. Therefore, when the TFT is on, charge carriers generated in a channel are easily captured by the above defects during transmission, thereby reducing the mobility of the charge carriers. Therefore, a property of the TFT is affected.

SUMMARY

Some embodiments of the present disclosure adopt the following technical solutions.

In a first aspect of some embodiments of the present disclosure, a thin film transistor is provided, comprising: a bottom gate electrode; a bottom gate electrode insulating layer, a semiconducting active layer and a first insulating layer which are disposed on the bottom gate electrode in sequence; a source electrode and a drain electrode which are disposed at a side of the first insulating layer away from the bottom gate electrode; vias disposed in the first insulating layer at positions which correspond to the source electrode and the drain electrode respectively; and ohmic contact layers disposed on and covering the semiconducting active layer at positions corresponding to the vias respectively. Each of the source electrode and the drain electrode is in contact with a corresponding one of the ohmic contact layers through a corresponding one of the vias.

Optionally, the thin film transistor further comprises a top gate electrode located on a side of the first insulating layer away from the bottom gate electrode, and the first insulating layer is a top gate electrode insulating layer.

Optionally, the top gate electrode is in a same layer and of same material as the source electrode and the drain electrode.

Optionally, the bottom gate electrode is non-electrically connected with the top gate electrode.

Optionally, a material of the semiconducting active layer comprises hydrogenated amorphous silicon, and a material of the ohmic contact layers comprises n-type heavily-doped hydrogenated amorphous silicon.

In another aspect of some embodiments of the present disclosure, an array substrate is provided, comprising thin film transistors, wherein one of the thin film transistors is the thin film transistor according to any one as above described.

Optionally, the array substrate comprises a plurality of sub-pixels arranged into a matrix, each of the plurality of sub-pixels is provided therein with at least one of the thin film transistors. In a case that one of the thin film transistors comprises a bottom gate electrode and a top gate electrode, the top gate electrode and the bottom gate electrode are connected to different signal lines.

In another aspect of some embodiments of the present disclosure, a display device is provided, comprising the array substrate according to any one as above described.

In another aspect of some embodiments of the present disclosure, a manufacturing method of a thin film transistor is provided, which is applied to manufacture the thin film transistor according to any one as above described and comprises: forming a bottom gate electrode, a bottom gate electrode insulating layer and a semiconducting active layer in sequence via a patterning process on a base substrate; forming a first insulating layer via a patterning process on the base substrate on which the semiconducting active layer has been formed, and forming vias in the first insulating layer at positions corresponding to an area where a source electrode is to be formed and an area where a drain electrode is to be formed; forming, in the vias, ohmic contact layers covering the semiconducting active layer via a patterning process, on the base substrate on which the first insulating layer has been formed; and forming the source electrode and the drain electrode at a side of the first insulating layer away from the bottom gate electrode via a patterning process, on the base substrate on which the ohmic contact layers have been formed. Each of the source electrode and the drain electrode is in contact with a corresponding one of the ohmic contact layers through a corresponding one of the vias.

Optionally, the manufacturing method of the thin film transistor further comprises: forming a top gate electrode via a patterning process on the substrate on which the source electrode and the drain electrode are formed.

Optionally, the source electrode, the drain electrode and the top gate electrode are formed via a single patterning process.

Optionally, a material of the semiconducting active layer comprises hydrogenated amorphous silicon, and a material of the ohmic contact layers comprises n-type heavily-doped hydrogenated amorphous silicon.

BRIEF DESCRIPTION OF THE DRAWINGS

In order to describe technical solutions in embodiments of the present disclosure or in the prior art more clearly, the accompanying drawings to be used in the description of embodiments or the prior art will be introduced briefly. Obviously, the accompanying drawings to be described below are merely some embodiments of the present disclosure, and a person of ordinary skill in the art can obtain other drawings according to those drawings without paying any creative effort.

DETAILED DESCRIPTION

The technical solutions in the embodiments of the present disclosure will be described clearly and completely with reference to the accompanying drawings in the embodiments of the present disclosure. Obviously, the described embodiments are merely a part of but not all of the embodiments of the present disclosure. All other embodiments made on the basis of the embodiments of the present disclosure by a person of ordinary skill in the art without paying any creative effort shall be included in the protection scope of the present disclosure.

Some embodiments of the present disclosure provide a thin film transistor and a manufacturing method thereof, an array substrate and a display device. In a manufacturing process of the TFT, a defect generating probability in the semiconducting active layer can be reduced. The thin film transistor includes: a bottom gate electrode; a bottom gate electrode insulating layer, a semiconducting active layer and a first insulating layer which are disposed on the bottom gate electrode in sequence; a source electrode and a drain electrode which are disposed at one side of the first insulating layer away from the bottom gate electrode; vias disposed in the first insulating layer at positions which correspond to the source electrode and the drain electrode respectively; and ohmic contact layers disposed on and covering the semiconducting active layer at positions corresponding to the vias respectively. Each of the source electrode and the drain electrode is in contact with a corresponding one of the ohmic contact layers through a corresponding one of the vias. It can be seen from the above that the first insulating layer is located on the semiconducting active layer. And the positions of the vias in the first insulating layer correspond to the positions of the source electrode and drain electrode of the thin film transistor, respectively. Therefore, the upper surface of the semiconducting active layer is covered by the first insulating layer except for parts corresponding to the vias described above. In this way, it is able to ensure that the upper surface of a part of the semiconducting active layer at a channel position of the thin film transistor is covered by the first insulating layer. Based on this, in a process of forming the ohmic contact layers located on and covering the semiconducting active layer at the positions corresponding to the vias described above, when to pattern the ohmic contact layers, the part of the semiconducting active layer corresponding to the channel position of the thin film transistor is covered by the first insulating layer. Therefore, the upper surface of the part of the semiconducting active layer at the channel position is not affected by an etching process for the ohmic contact layers, and thus is not roughened. So that, the defect generating probability in the semiconducting active layer can be reduced. Therefore, in the structure of the thin film transistor provided by the present disclosure, the upper surface of the part of the semiconducting active layer at the channel position of the thin film transistor is smooth and has less defects, which helps to improve the mobility in the thin film transistor.

Figure 2:
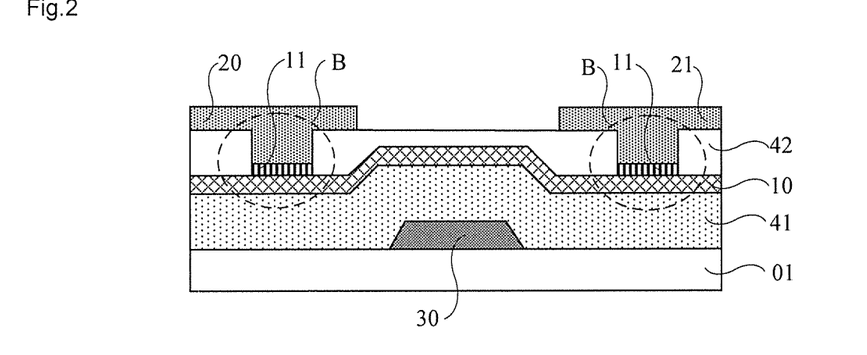
FIG. 2 is a schematic structural diagram of another TFT provided by some embodiments of the present disclosure.

Some embodiments of the present disclosure provide a thin film transistor (hereinafter referred to as TFT), as shown in FIG. 2, including: a bottom gate electrode 30 (BG); a bottom gate electrode insulating layer 41, a semiconducting active layer 10 and a first insulating layer 42 which are disposed on the bottom gate electrode 30 in sequence.

It should be noted that a material of the bottom gate electrode insulating layer 41 comprises silicon nitride or silicon oxide. Or, the bottom gate electrode insulating layer 41 is also able to be composed of at least two thin film layers. Taking a case of two thin film layers as an example, a thin film layer in contact with the bottom gate electrode 30 is a silicon nitride layer or a silicon oxynitride layer. This thin film layer is able to prevent impurities in a base substrate 01 or metal ions in the bottom gate electrode 30 from diffusing into the semiconducting active layer 10, and prevent the bottom gate electrode 30 from being oxidized. In addition, a thin film layer in contact with the semiconducting active layer 10 is a silicon oxide layer or a silicon oxynitride layer. This thin film layer can improve the sealing property of the semiconducting active layer 10. Or, in a case that the bottom gate electrode insulating layer 41 is composed of three thin film layers, a thin film layer in contact with the bottom gate electrode 30 is a silicon nitride layer, a thin film layer in contact with the semiconducting active layer 10 is a silicon oxide layer, and a thin film layer between the silicon nitride layer and the silicon oxide layer is a silicon oxynitride layer. Of course, the above merely shows illustrations to explain the bottom gate electrode insulating layer 41 being composed of a plurality of thin film layers, and other examples will not be reiterated herein.

In addition, the TFT further includes a source electrode 20 and a drain electrode 21 disposed on a side of the first insulating layer 42 away from the bottom gate electrode. The first insulating layer 42 is provided with vias B at positions corresponding to the source electrode 20 and the drain electrode 21 respectively.

Ohmic contact layers 11 are disposed on and cover the semiconducting active layer 10 at positions which correspond to the vias B. Each of the source electrode 20 and the drain electrode 21 is in contact with a corresponding one of the ohmic contact layers 11 through a corresponding one of the vias B. In this case, the ohmic contact layers 11 are able to electrically connect the source electrode 20 to the semiconducting active layer 10 and electrically connect the drain electrode 21 to the semiconducting active layer 10, respectively. Moreover, the contact resistance between the source electrode 20 (or the drain electrode 21) and the semiconducting active layer 10 can be reduced by an ohmic contact layer 11.

Based on this, a material of the semiconducting active layer 10 comprises amorphous silicon (a-Si) or hydrogenated amorphous silicon (a-Si:H). A material of which the ohmic contact layers 11 comprises n-type heavily-doped amorphous silicon (n+a-Si) or n-type heavily-doped hydrogenated amorphous silicon (n+a-Si:H). The ohmic contact layers 11 are able to be formed by performing a heavy doping process with n-type particles to a layer of the amorphous silicon (a-Si) material or the hydrogenated amorphous silicon (a-Si:H) material. Optionally, at least the hydrogenated amorphous silicon (a-Si:H) is adopted to form the semiconducting active layer 10, or at least the n-type heavily-doped hydrogenated amorphous silicon (n+a-Si:H) is adopted to form the ohmic contact layers 11. In this way, in the semiconducting active layer 10 and/or the ohmic contact layers 11, by introducing hydrogen atoms, the number of dangling bond defects in a thin film can be reduced, and the probability of charge carriers being trapped can be reduced, so that the mobility of the charge carriers can be improved. For convenience of explanation, in the following, the material of the semiconducting active layer 10 comprises the hydrogenated amorphous silicon (a-Si:H), and the material of the ohmic contact layers 11 comprises the n-type heavily-doped hydrogenated amorphous silicon (n+a-Si:H).

In conclusion, as shown in FIG. 2, the first insulating layer 42 is located on the semiconducting active layer 10. And the positions of the vias B in the first insulating layer 42 correspond to the positions of the source electrode 20 and the drain electrode 21 of the TFT, respectively. Therefore, the upper surface of the semiconducting active layer 10 is covered by the first insulating layer 42 except for parts corresponding to the vias B described above. In this way, it is able to ensure that the upper surface of a part of the semiconducting active layer 10 at a TFT channel position is covered by the first insulating layer 42. Based on this, in a process of forming the ohmic contact layers 11 located on and covering the semiconducting active layer 10 at the positions which correspond to the vias B described above, when to pattern the ohmic contact layers 11, the part of the semiconducting active layer 10 corresponding to the TFT channel position is covered by the first insulating layer 42. Therefore, the upper surface of the part of the semiconducting active layer 10 at the channel position is not affected by an etching process for the ohmic contact layers, and thus is not roughened. So that, a defect generating probability in the semiconducting active layer 10 can be reduced. Therefore, in the structure of the TFT provided by the present disclosure, the upper surface of the part of the semiconducting active layer 10 at the TFT channel position is smooth and has few defects, which helps to improve the mobility in the TFT.

Figure 3:
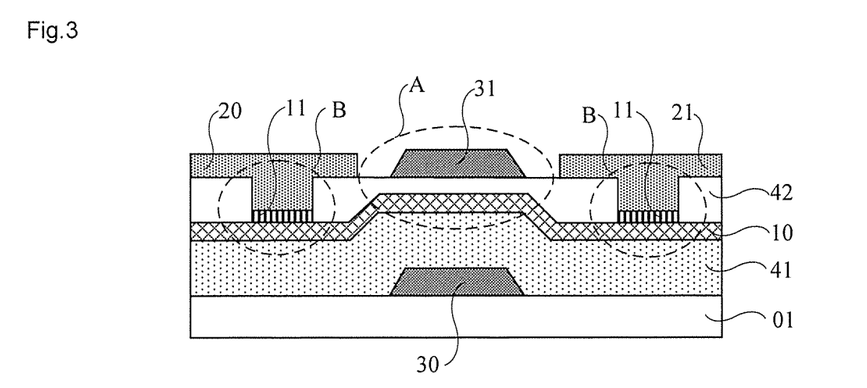
FIG. 3 is a schematic structural diagram of a double-gate electrode TFT provided by some embodiments of the present disclosure.

Based on this, in order to further enhance a property of the TFT, optionally, as shown in FIG. 3, the TFT further includes a top gate electrode 31 (TG) located on a side of the first insulating layer 42 away from the bottom gate electrode 30. The first insulating layer 42 is a top gate electrode insulating layer.

It will be noted that, when the bottom gate electrode 31 is disposed on the upper surface of the first insulating layer 42, the first insulating layer 42 is the top gate electrode insulating layer, means that the first insulating layer 42 is required to function as a gate electrode insulator (GI), and has a texture more dense than a general insulating layer. The top gate electrode insulating layer is disposed in the same manner with the bottom gate electrode insulating layer 41, which will not be reiterated herein.

Moreover, at present, the technical personnel in the art are generally working on the study of the use of a double-gate electrode structure in a TFT in which the semiconducting active layer is made of a-indium gallium zinc oxide (a-IGZO). Such study can often obtain significant results, for example, in solving the problem of threshold voltage shift of an oxide (Oxide Vth Shift). But in the field of display technology, the amorphous silicon (a-Si) remains the main material of the semiconducting active layer. However, the technical personnel in the art rarely use the double-gate electrode structure in a TFT in which the semiconducting active layer is made of the amorphous silicon (a-Si) (hereinafter referred to as a-Si TFT). This is because a large number of related studies have shown that when the double-gate electrode structure is applied to an a-Si TFT, only slight improvement in the property of the TFT is provided.

Figure 1:
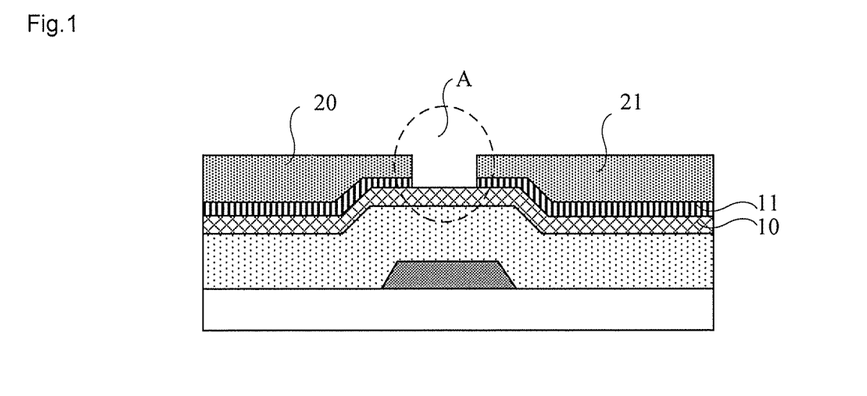
FIG. 1 is a schematic structural diagram of a TFT provided by some embodiments of the present disclosure.

However, as a discovery from the in-depth study of the present disclosure, the reason why the property of the a-Si TFT with the double-gate electrode structure is not able to be effectively improved is that, as shown in FIG. 1, in order to avoid short circuit between a source electrode 20 and a drain electrodes 21 during a process of manufacturing a TFT, an ohmic contact layer 11 on a surface of a semiconducting active layer 10 needs to be over etched to ensure that an ohmic contact layer 11 below the source electrode 20 and an ohmic contact layer 11 below the drain electrode 21 are completely disconnected. However, the above over-etching process will affect the shape and appearance of the top surface of the semiconducting active layer 10, resulting in a rough upper surface of a part of the semiconducting active layer 10 at the position of a TFT channel A, with more defects. In this way, when the TFT is on, charge carriers generated in the channel are easily captured by the above defects during the transmission, thereby reducing the mobility of the charge carriers. Therefore, a property of the TFT is affected.

Based on this, on the one hand, since in the present disclosure the upper surface of the part of the semiconducting active layer 10 at the TFT channel position A is covered by the first insulating layer 42, the ohmic contact layers 11 are not deposited directly at a back channel of the TFT. Therefore, an etching process for the ohmic contact layers 11 does not affect the flatness of the upper surface of the part of the semiconducting active layer 10 at the TFT channel position A, so that the back channel of the TFT has a higher conduction property. On the other hand, the TFT has a double-gate electrode structure, so it is able to increase the number of charge carriers in the semiconducting active layer 10 of the TFT, and makes the distribution of the charge carriers more uniform. In addition, both the surface close to the bottom gate electrode 30 and the surface close to the top gate electrode 31, of the part of the semiconducting active layer 10 at the TFT channel position, are smooth and have less defects. Therefore, the semiconducting active layer 10 of the TFT has a higher conductivity, so that the property of the double-gate electrode a-Si TFT can be greatly improved. In conclusion, the present disclosure breaks through a thinking set of the traditional design in the field, improves the structure and manufacturing process of the TFT, and introduces the double-gate electrode into the improved TFT structure, making the double-gate electrode a-Si TFT also have a better property. As a result, the applicable scope of the double-gate electrode a-Si TFT is improved.

Based on this, in the present disclosure, the top gate electrode 31 is able to be electrically connected to the bottom gate electrode 30. For example, the top gate electrode 31 is electrically connected to the bottom gate electrode 30 by making a via. Or, the top gate electrode 31 is electrically connected to the bottom gate electrode 30 by a same signal line. Further, the top gate electrode 31 is also able to be non-electrically connected to the bottom gate electrode 30. In the present disclosure, the connection mode between the top gate electrode 31 and the bottom gate electrode 30 is not limited. However, the mobility in the TFT at different positions differs, due to different manufacturing processes, production lines, production material or factors the like. Thus, in an embodiment of the present disclosure, the bottom gate electrode 30 and the top gate electrode 31 are non-electrically connected. In this way, according to needs, a person skilled in the art is able to provide separate control and debugging for a voltage applied to the bottom gate electrode 30 and a voltage applied to the top gate electrode 31 respectively, thereby enabling the double-gate electrode a-Si TFT to obtain a best property.

Further, a material of the top gate electrode 31 comprises the same as the material of the bottom gate electrode 30, for example, metal chromium (Cr), a chromium alloy, an alloy of molybdenum and tantalum (Mo Ta), metal aluminium (Al) or an aluminium alloy, etc. Or, the material of the top gate electrode 31 also be comprises the same as the material of the source electrode 20 and the drain electrode 21, for example, the metal chromium (Cr), the metal aluminium (Al) or the aluminium alloy. In order to simplify the manufacturing process, the top gate electrode 31 is able to be in the same layer and of the same material as the source electrode 20 and the drain electrode 21. In this way, the top gate electrode 31, the source electrode 20 and the drain electrode 21 are able to be manufactured via a single patterning process.

It will be noted that the patterning process in the present disclosure may include only a photolithography process (MASK), or include a photolithography process and an etching step, and it is able to further include other processes for forming predetermined patterns, such as a printing process, an inkjet process, and the like. The photolithography process refers to a process which is for forming a pattern by using a photoresist, a mask plate, an exposure machine and the like, and which includes a film forming processing procedure, an exposure processing procedure, a development processing procedure and the like. The corresponding patterning process is able to be selected according to the structure to be formed in the present disclosure. In addition, the single patterning process in some embodiments of the present disclosure, is explained by an example that different exposure regions are formed via a single mask-exposure-development process, and then subject to removal processes multiple times, such as etching, ashing, etc., resulting in obtaining the desired pattern.

Some embodiments of the present disclosure provide an array substrate including the TFT as any one of the above. The array substrate is provided with a same beneficial effect as that of the TFT provided by the foregoing embodiments, and it will not be reiterated herein.

Figure 4:
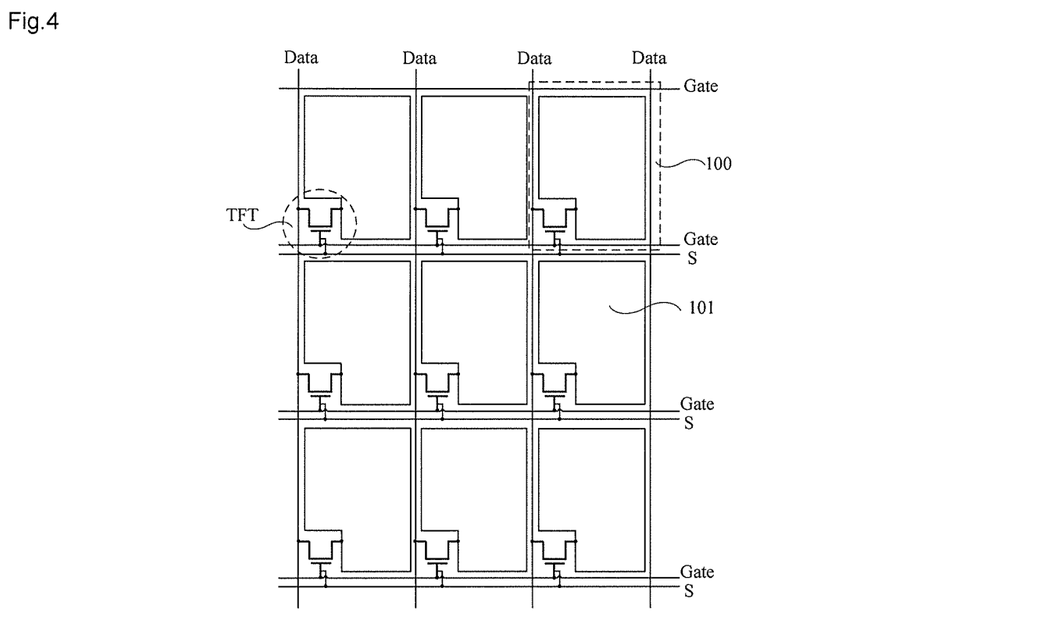
FIG. 4 is a schematic structural diagram of an array substrate having the TFT as shown in FIG. 3, provided by some embodiments of the present disclosure.

As shown in FIG. 4, the array substrate includes a plurality of sub-pixels 100 which are arranged into a matrix. The plurality of sub-pixels are defined by criss-cross gate lines and data lines.

Figure 15:
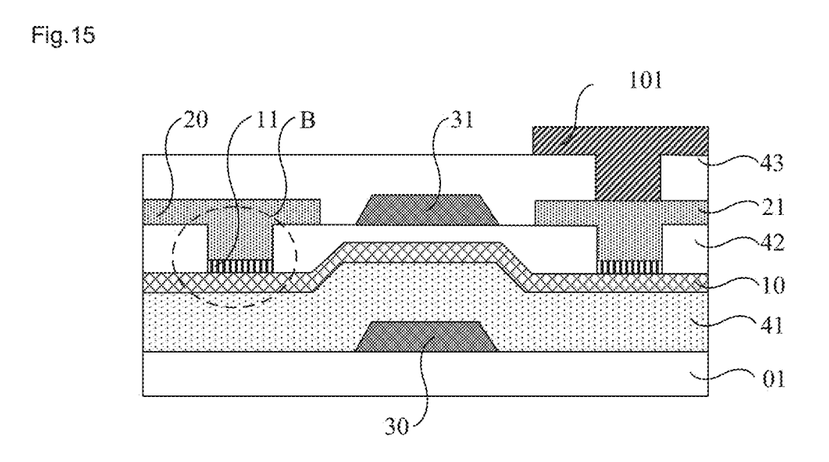
FIG. 15 is a schematic structural diagram of an array substrate provided with both the TFT as shown in FIG. 3 and a pixel electrode.

Based on this, it will be noted that the applicable scope of the array substrate is not limited in the present disclosure. For example, the above array substrate is able to be applied to an LCD, where each of the plurality of sub-pixels 100 is generally provided with one TFT, as shown in FIG. 4 and FIG. 15, a gate electrode of the TFT is connected to a gate line (Gate), a source electrode of the T is connected to the data line (Data), and a drain electrode of the TFT is connected to a pixel electrode 101. Or, the above array substrate is also able to be applied to an OLED display device, where each of the plurality of sub-pixels is provided with a pixel driving circuit configured to drive a light emitting component (LED or OLED), and the driving circuit includes a plurality of TFTs.

In this case, when a TFT includes a bottom gate electrode 30 and a top gate electrode 31 as shown in FIG. 3, in each of the above one TFT or the plurality of TFTs, the top gate electrode 31 and the bottom gate electrode 30 are connected to different signal lines. Specifically, for example, in FIG. 4, near each gate line (Gate) is disposed an additional signal line S parallel to the gate line (Gate). At this time, in each of the above one TFT or the plurality of TFTs, the top gate electrode 31 and the bottom gate electrode 30 are able to be connected to the gate line (Gate) and the additional signal line S, respectively. In this way, by providing separate control and debugging for a voltage applied to the bottom gate electrode 30 and a voltage applied to the top gate electrode 31 through the gate line (Gate) and the additional signal line S respectively, it makes the TFT which is a double-gate electrode a-Si TFT obtain a best property. Therefore, it may overcome the problem that a property of the TFT differs due to a mobility in the TFT differing at different positions when the bottom gate electrode 30 is electrically connected to the top gate electrode 31.

Figure 14:
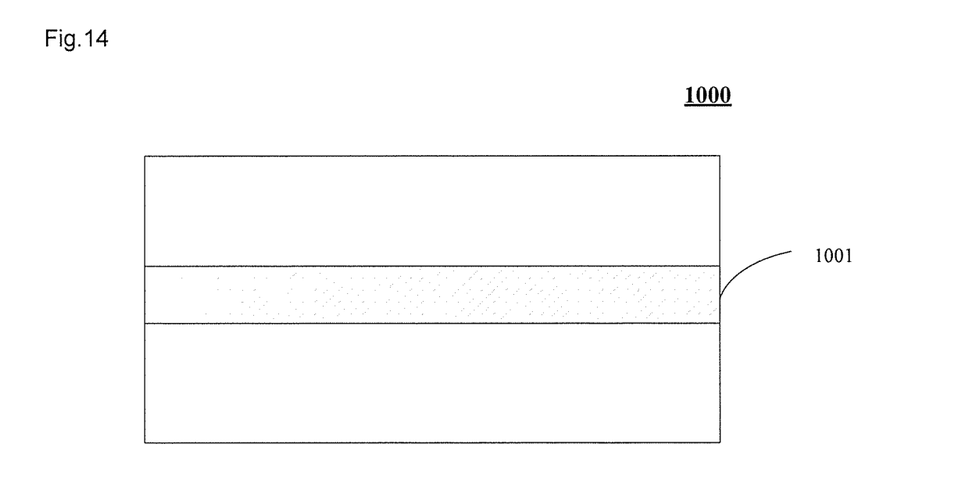
FIG. 14 is a schematic structural diagram of a display device, including an array substrate provided by some embodiments of the present disclosure.

Some embodiments of the present disclosure provide a display device 1000, as shown in FIG. 14, including the array substrate 1001 as any one of the above. The display device is provided with a beneficial effect the same as that of the TFT provided by some foregoing embodiments, and it will not reiterated herein.

Figure 5:
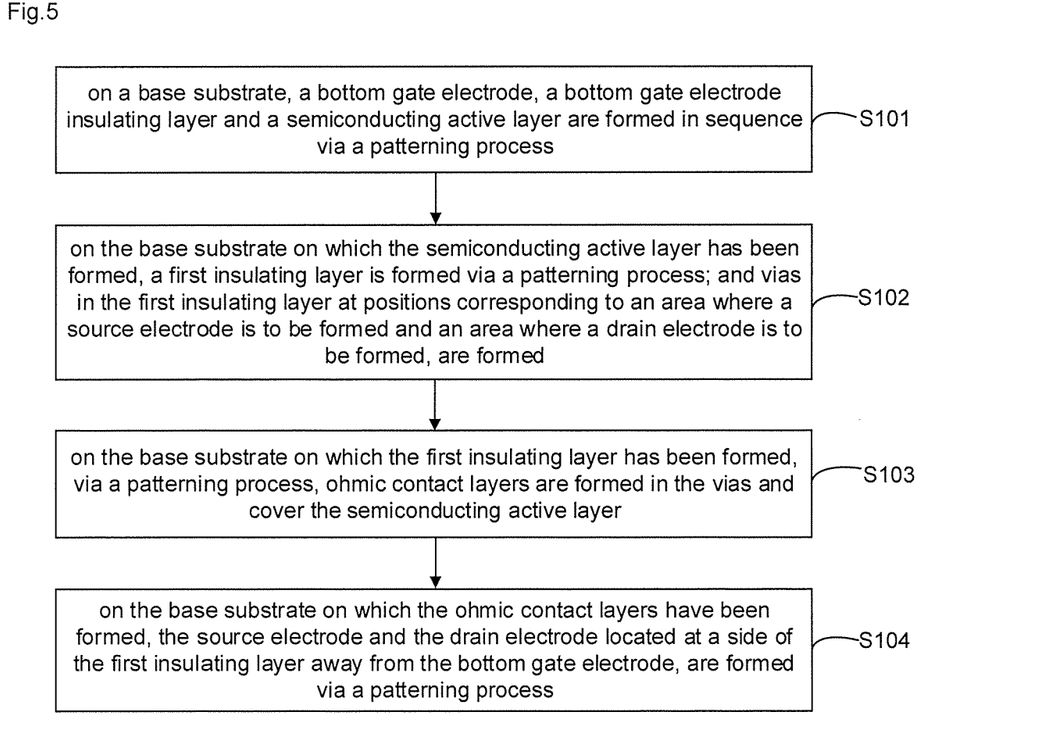
FIG. 5 is a flowchart of a method of manufacturing a TFT provided by some embodiments of the present disclosure.

Some embodiments of the present disclosure provide a manufacturing method of a TFT, as shown in FIG. 5, including the following steps 101-104 (S101-S104).

Figure 6:
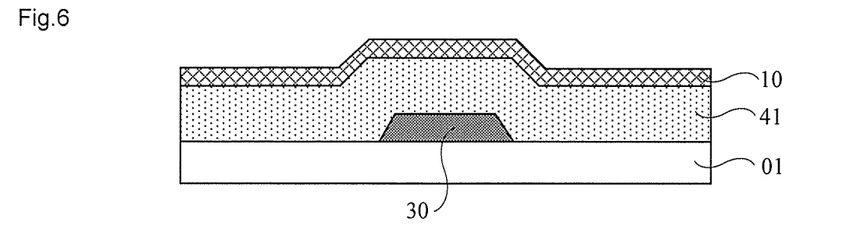
FIG. 6 to FIG. 12 are schematic diagrams of procedures for manufacturing the TFT as shown in FIG. 2, provided by some embodiments of the present disclosure.

S101, as shown in FIG. 6, on a base substrate 01, a bottom gate electrode 30, a bottom gate electrode insulating layer 41 and a semiconducting active layer 10 are formed in sequence via a patterning process.

A material of the semiconducting active layer 10 comprises amorphous silicon (a-Si) or hydrogenated amorphous silicon (a-Si:H).

Figure 7:
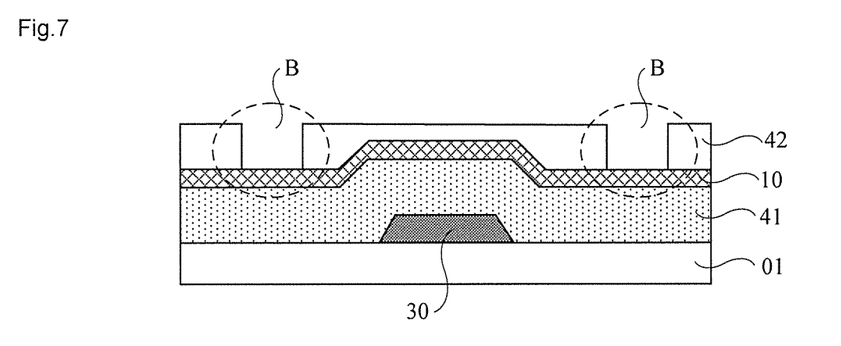

S102, as shown in FIG. 7, on the base substrate 01 on which the semiconducting active layer 10 has been formed, a first insulating layer 42 is formed via a patterning process; and vias B in the first insulating layer 42 at positions corresponding to an area where a source electrode is to be formed and an area where a drain electrode is to be formed, are formed.

Specifically, the vias are able to be formed by the following steps: the first insulating layer 42 is subject to a photolithography process, so that in the substrate 01 having the first insulating layer 42, the area where the source electrode 20 is to be formed and the area where the drain electrode 21 is to be formed are not covered by photoresist; next, the areas uncovered by the photoresist in the first insulating layer 42 are etched via dry etching, forming the vias B.

S103, on the base substrate 01 on which the first insulating layer 42 has been formed, as shown in FIG. 2, via a patterning process, ohmic contact layers 11 are formed in the vias and cover the semiconducting active layer 10.

A material of the ohmic contact layers 11 comprises n-type heavily-doped amorphous silicon (n+a-Si) or n-type heavily-doped hydrogenated amorphous silicon (n+a-Si:H).

Taking a case that the material of the ohmic contact layers 11 is the n-type heavily-doped hydrogenated amorphous silicon as an example, the procedure of manufacturing the ohmic contact layers 11 will be described in detail.

Figure 8:
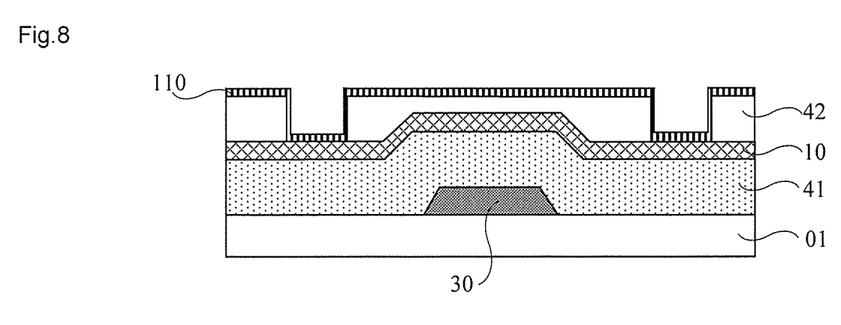

Specifically, first as shown in FIG. 8, on the base substrate 01 on which the first insulating layer 42 has been formed, an n-type heavily-doped hydrogenated amorphous silicon layer 110 is deposited.

Next, a layer of photoresist 111 covers the n-type heavily-doped hydrogenated amorphous silicon layer 110 described above. The photoresist 111 is then exposed under being masked by a mask plate 112.

Figure 9:
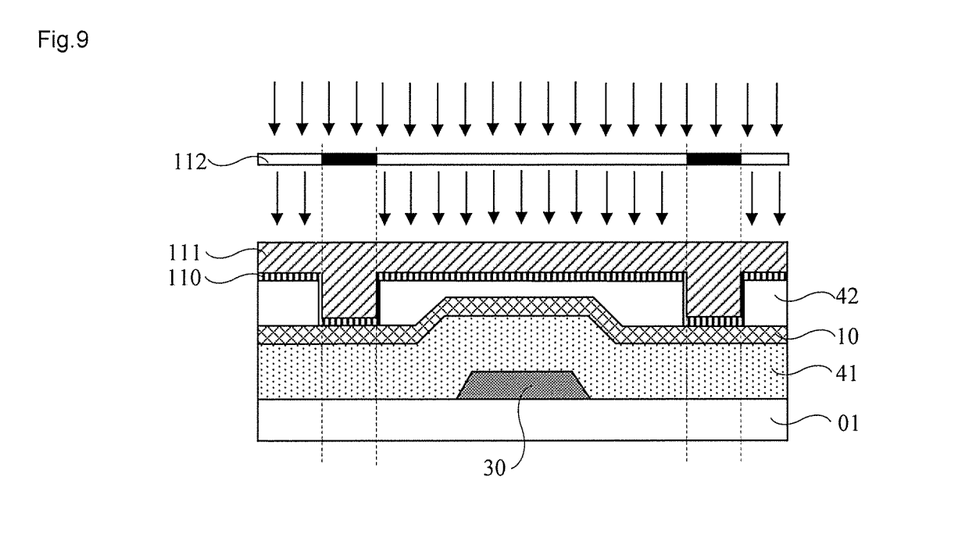
Figure 10:
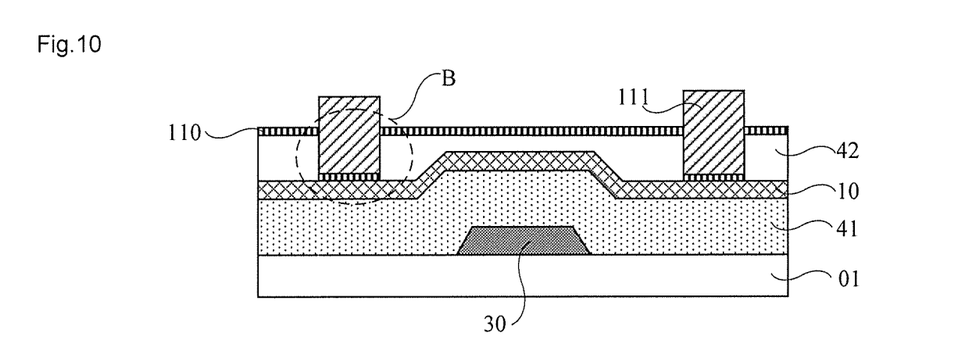

The photoresist 111 is able to be positive photoresist or negative photoresist. This disclosure uses the positive photoresist as an example. At this time, as shown in FIG. 9, a light transmission area of the mask plate 112 corresponds to a position in the photoresist 111 which needs to be developed. Based on this, after a photolithography process, as shown in FIG. 10, parts of the n-type heavily-doped hydrogenated amorphous silicon layer 110 at the positions of the vias B are covered by the photoresist.

Figure 11:
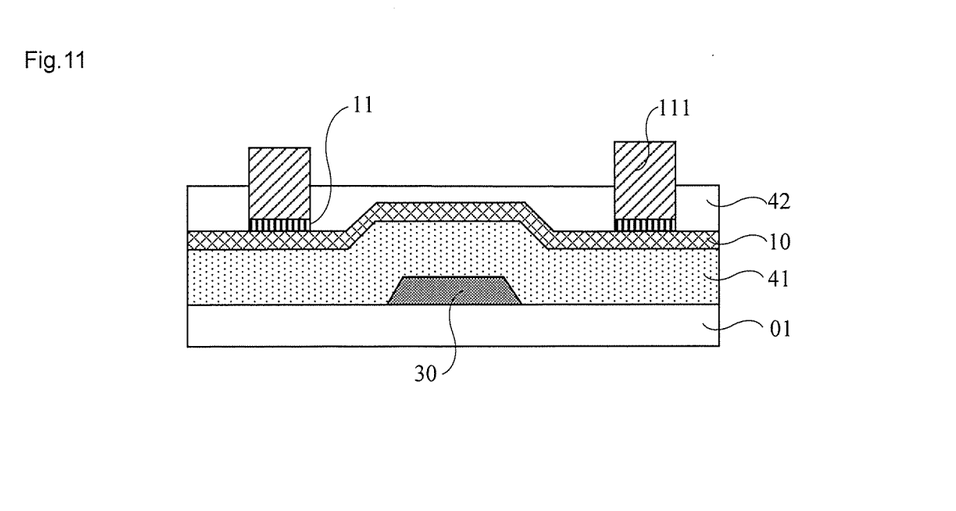
Figure 12:
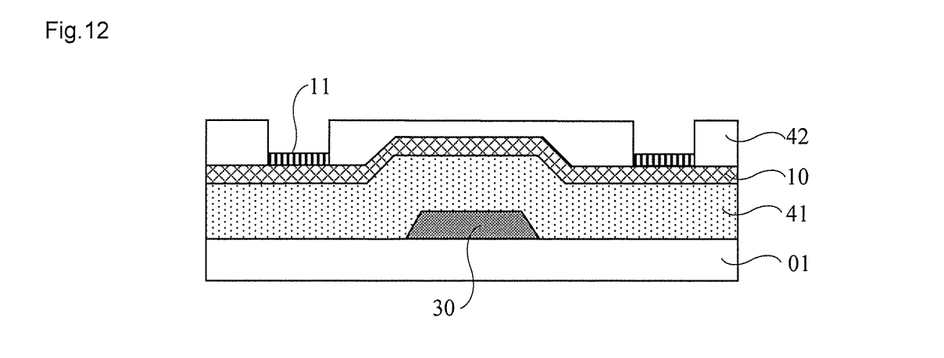
Figure 13:
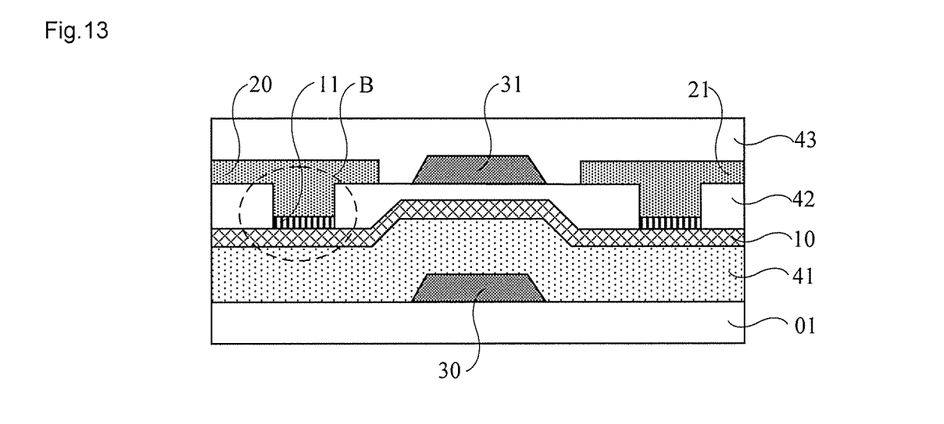
FIG. 13 is a schematic structural diagram of an array substrate provided with the TFT as shown in FIG. 3 provided by some embodiments of the present disclosure.

Next, as shown in FIG. 11, a part of the n-type heavily-doped hydrogenated amorphous silicon layer 110 in an area uncovered by the photoresist 111, is etched. The photoresist 11 is then stripped off, forming the ohmic contact layers 11 as shown in FIG. 2.

S104, as shown in FIG. 2, on the base substrate 01 on which the ohmic contact layers 11 have been formed, the source electrode 20 and the drain electrode 21 located at a side of the first insulating layer 42 away from the bottom gate electrode 30, are formed via a patterning process.

Each of the source electrode 20 and the drain electrode 21 is in contact with a corresponding one of the ohmic contact layers 11 through a corresponding one of the vias B.

The method of manufacturing the TFT has a beneficial effect the same as that of the TFT provided by some foregoing embodiments, and it will not be reiterated herein.

On the basis of this, in order to further enhance a property of the TFT, the method of manufacturing the TFT further includes: on the substrate 01 on which the source electrode 20 and the drain electrode 21 are formed, a top gate electrode 31 is formed via a patterning process.

In this way, on the one hand, since in the present disclosure, the upper surface of a part of the semiconducting active layer 10 at a TFT channel position A is covered by the first insulating layer 42, the ohmic contact layers 11 are not deposited directly at a back channel of the TFT. Therefore, the etching process for the ohmic contact layers 11 does not affect the flatness of the upper surface of the part of the semiconducting active layer 10 at the TFT channel position A, so that the back channel of the TFT has a higher conduction property. On the other hand, the TFT has a double-gate electrode structure, so it is able to increase the number of charge carriers in the semiconducting active layer 10 of the TFT, and makes the distribution of the charge carriers more uniform. In addition, both the surface close to the bottom gate electrode 30 and the surface close to the top gate electrode 31, of the part of the semiconducting active layer 10 at the TFT channel position, are smooth and have less defects. Therefore, the semiconducting active layer 10 of the TFT has a higher conductivity, so that the property of the double-gate electrode a-Si TFT can be greatly improved.

In conclusion, the present disclosure breaks through a thinking set of the traditional design in the field, improves the structure and the manufacturing process of the TFT, and introduces the double-gate electrode into the improved TFT structure, making the double-gate electrode a-Si TFT also have a better property. As a result, the applicable scope of the double-gate electrode a-Si TFT is improved.

On the basis of this, in order to simplify the manufacturing process, the top gate electrode 31, the source electrode 20 and the drain electrode 21 are able to be formed via a single patterning process.

Based on this, when an array substrate includes the TFT as above described, a method of manufacturing the array substrate also includes the method of manufacturing the TFT. In addition, the method of manufacturing the array substrate further includes forming a passivation layer 43 (PVX) and a pixel electrode in sequence on a base substrate 01 on which a source electrode 20 and a drain electrode 21 have been formed. The pixel electrode is electrically connected to the drain electrode 21 through a via in the passivation layer 43.

A material of the passivation layer 43 is substantially the same as the material of the bottom gate electrode insulating layer 41 and the material of the first insulating layer 42, for example, able to include silicon nitride or silicon oxide. Both a specific passivation layer 43 and a specific bottom gate electrode insulating layer 41 are able to be prepared via a process of plasma chemical vapor deposition (PCVD). And, the density of the bottom gate electrode insulating layer 41 is generally greater than the density of the passivation layer 43. Therefore, it needs to adjust parameters of the process of PCVD to form thin films with different densities.

The foregoing descriptions merely show specific implementations of the present disclosure, but the protection scope of the present disclosure is not limited thereto. Variations or replacements that can be easily conceived by any person skilled in the art within the technical scope disclosed by the present disclosure shall fall into the protection scope of the disclosure. Therefore, the protection scope of the present disclosure should be subject to the protection scope of the claims.

Additional embodiments including any one of the embodiments described above may be provided by the disclosure, where one or more of its components, functionalities or structures are interchanged with, replaced by or augmented by one or more of the components, functionalities or structures of a different embodiment described above.

What is claimed is:

1. An array substrate, comprising a plurality of sub-pixels arranged into a matrix, each of the plurality of sub-pixels being provided therein with at least one thin film transistor and a pixel electrode;

wherein the at least one thin film transistor comprises:

a bottom gate electrode;

a bottom gate electrode insulating layer, a semiconducting active layer and a first insulating layer which are disposed on the bottom gate electrode in sequence, wherein a material of the semiconducting active layer comprises amorphous silicon (a-Si) or hydrogenated amorphous silicon (a-Si: H);

a source electrode and a drain electrode which are disposed at a side of the first insulating layer away from the bottom gate electrode;

vias disposed in the first insulating layer at positions which correspond to the source electrode and the drain electrode respectively; and ohmic contact layers disposed on and covering the semiconducting active layer at positions corresponding to the vias respectively, wherein each of the source electrode and the drain electrode is in contact with a corresponding one of the ohmic contact layers through a corresponding one of the vias;

a top gate electrode located on a side of the first insulating layer away from the bottom gate electrode, wherein the first insulating layer is a top gate electrode insulating layer;

wherein the pixel electrode is electrically connected to the drain electrode through a via in a passivation layer, and the passivation layer is located between the drain electrode and the pixel electrode.

2. A manufacturing method of an array substrate, applied to manufacture the array substrate according to claim 1 and comprising:

forming a bottom gate electrode, a bottom gate electrode insulating layer and a semiconducting active layer in sequence via a patterning process on a base substrate, wherein a material of the semiconducting active layer comprises amorphous silicon (a-Si) or hydrogenated amorphous silicon (a-Si: H);

forming a first insulating layer via a patterning process on the base substrate on which the semiconducting active layer has been formed, and forming vias in the first insulating layer at positions corresponding to an area where a source electrode is to be formed and an area where a drain electrode is to be formed;

forming, in the vias, ohmic contact layers covering the semiconducting active layer via a patterning process, on the base substrate on which the first insulating layer has been formed; and forming the source electrode and the drain electrode at a side of the first insulating layer away from the bottom gate electrode via a patterning process, on the base substrate on which the ohmic contact layers have been formed, wherein each of the source electrode and the drain electrode is in contact with a corresponding one of the ohmic contact layers through a corresponding one of the vias;

forming a top gate electrode via a patterning process on the base substrate on which the source electrode and the drain electrode are formed;

forming a passivation layer on the base substrate on which the top gate electrode is formed;

forming a pixel electrode on the base substrate on which the passivation layer is formed, wherein the pixel electrode is electrically connected to the drain electrode through a via in the passivation layer.

3. The manufacturing method of the array substrate according to claim 1, wherein, a material of which the ohmic contact layers comprises n-type heavily-doped amorphous silicon or n-type heavily-doped hydrogenated amorphous silicon.

4. The manufacturing method of the array substrate according to claim 1, wherein the source electrode, the drain electrode and the top gate electrode are formed via a single patterning process.

5. The array substrate according to claim 1, wherein, a material of the ohmic contact layers comprises n-type heavily-doped amorphous silicon or n-type heavily-doped hydrogenated amorphous silicon.

6. The array substrate according to claim 1, wherein the top gate electrode is in a same layer and of same material as the source electrode and the drain electrode.

7. The array substrate according to claim 4, wherein, the top gate electrode and the bottom gate electrode are connected to different signal lines.

8. The array substrate according to claim 1, wherein the bottom gate electrode is non-electrically connected with the top gate electrode.

9. A display device, comprising the array substrate according to claim 1.

* * * * *

UNITED STATES PATENT AND TRADEMARK OFFICE
CERTIFICATE OF CORRECTION

PATENT NO. : 11,094,799 B2  
APPLICATION NO. : 15/780166  
DATED : August 17, 2021  
INVENTOR(S) : Bingqiang Gui et al.

Page 1 of 1

It is certified that error appears in the above-identified patent and that said Letters Patent is hereby corrected as shown below:

In the Specification

Column 7 Line 10 should read:  
Further, a material of the top gate electrode 31 comprises the same as the material of the bottom gate electrode 30, for example, metal chromium (Cr), a chromium alloy, an alloy of molybdenum and tantalum (Mo Ta), metal aluminium (Al) or an aluminium alloy, etc. Or, the material of the top gate electrode 31 also comprises the same as the material of the source electrode 20 and the drain electrode 21, for example, the metal chromium (Cr), the metal aluminium (Al) or the aluminium alloy. In order to simplify the manufacturing process, the top gate electrode 31 is able to be in the same layer and of the same material as the source electrode 20 and the drain electrode 21. In this way, the top gate electrode 31, the source electrode 20 and the drain electrode 21 are able to be manufactured via a single patterning process.

In the Claims

Column 12 Line 7 Claim 3 should read:  
3. The manufacturing method of the array substrate according to claim 2, wherein, a material of the ohmic contact layers comprises n-type heavily-doped amorphous silicon or n-type heavily-doped hydrogenated amorphous silicon.

Column 12 Line 4 Claim 4 should read:  
4. The manufacturing method of the array substrate according to claim 2, wherein the source electrode, the drain electrode and the top gate electrode are formed via a single patterning process.

Column 12 Line 23 Claim 7 should read:  
7. The array substrate according to claim 1, wherein, the top gate electrode and the bottom gate electrode are connected to different signal lines.

Signed and Sealed this  
Twenty-second Day of February, 2022

Drew Hirshfeld  
*Performing the Functions and Duties of the*  
*Under Secretary of Commerce for Intellectual Property and*  
*Director of the United States Patent and Trademark Office*